United States Patent
Zhu et al.

(10) Patent No.: US 9,553,233 B2
(45) Date of Patent: Jan. 24, 2017

(54) LIGHT EMITTING DIODE

(71) Applicants: Tsinghua University, Beijing (CN); HON HAI PRECISION INDUSTRY CO., LTD., New Taipei (TW)

(72) Inventors: Zhen-Dong Zhu, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/983,387

(22) Filed: Dec. 29, 2015

(65) Prior Publication Data

US 2016/0149080 A1 May 26, 2016

Related U.S. Application Data (63) Continuation of application No. 13/912,476, filed on Jun. 7, 2013, now Pat. No. 8,946,729, and a continuation of application No. 14/541,151, filed on Nov. 14, 2014, now Pat. No. 9,257,603, which is a continuation of application No. 12/970,234, filed on Dec. 16, 2010, now Pat. No. 8,487,320.

(30) Foreign Application Priority Data

Jun. 4, 2010 (CN) .......................... 2010 1 0192156

(51) Int. Cl.
*H01L 33/00* (2010.01)
*H01L 33/20* (2010.01)
*H01L 33/02* (2010.01)

(52) U.S. Cl.
CPC ............... *H01L 33/20* (2013.01); *H01L 33/02* (2013.01); *H01L 2933/0083* (2013.01)

(58) Field of Classification Search
CPC .......................... H01L 33/02; H01L 2933/0083
See application file for complete search history.

(56) References Cited

U.S. PATENT DOCUMENTS

| 2006/0118803 A1* | 6/2006 | Lee | H01L 33/007 257/98 |
| 2006/0284187 A1* | 12/2006 | Wierer | B82Y 20/00 257/79 |
| 2008/0047929 A1* | 2/2008 | Wang | B29D 11/00365 216/24 |
| 2008/0185606 A1* | 8/2008 | Sano | H01L 33/42 257/98 |

\* cited by examiner

*Primary Examiner* — Bradley K Smith
(74) *Attorney, Agent, or Firm* — Zhigang Ma (57) ABSTRACT

A light emitting diode includes a substrate, a first semiconductor layer, an active layer, a second semiconductor layer, a first electrode, and a second electrode. The first semiconductor layer, the active layer, and the second semiconductor layer are orderly stacked on the substrate. The first electrode is electrically connected to the first semiconductor layer. The second electrode electrically is connected to the second semiconductor layer. The substrate has a number of three-dimensional nano-structures, and each of the number of three-dimensional nano-structures has a stepped structure.

11 Claims, 8 Drawing Sheets

LIGHT EMITTING DIODE

CROSS-REFERENCE TO RELATED APPLICATIONS

This application is a continuation of U.S. patent application Ser. No. 14/541,151, filed on Nov. 14, 2014, entitled, "LIGHT EMITTING DIODE," which is a continuation of U.S. patent application Ser. No. 13/912,476, filed on Jun. 7, 2013, entitled, "LIGHT EMITTING DIODE," which is a continuation of U.S. patent application Ser. No. 12/970,234, filed on Dec. 16, 2010, entitled, "LIGHT EMITTING DIODE," which claims all benefits accruing under 35 U.S.C. §119 from China Patent Application No. 201010192156.6, filed on Jun. 4, 2010 in the China Intellectual Property Office. The disclosures of the above-identified applications are incorporated herein by reference.

BACKGROUND

1. Technical Field

The present disclosure relates to a light emitting diode (LED).

2. Description of Related Art

Highly efficient LEDs made with GaN-based semiconductors have become widely used in different technologies, such as in display devices, large electronic bill boards, street lights, car lights, and other illumination applications. LEDs are environmentally friendly, and have a long working life and low power consumption.

A conventional LED commonly includes an N-type semiconductor layer, a P-type semiconductor layer, an active layer, an N-type electrode, and a P-type electrode. The active layer is located between the N-type semiconductor layer and the P-type semiconductor layer. The P-type electrode is located on the P-type semiconductor layer. The N-type electrode is located on the N-type semiconductor layer. Typically, the P-type electrode is transparent. In operation, a positive voltage and a negative voltage are applied respectively to the P-type semiconductor layer and the N-type semiconductor layer. Thus, holes from the P-type semiconductor layer and electrons from the N-type semiconductor layer can enter the active layer and combine with each other to emit visible light.

However, the light-extraction efficiency of LEDs is low because typical semiconductor materials have a higher refraction index than that of air. Wide-angle light emitted from the active layer may be internally reflected in LEDs, so that a large portion of the light emitted from the active layer will remain in the LEDs, thereby degrading the light-extraction efficiency.

A method for reducing internal reflection is to roughen a surface of an LED from which light is emitted to change an angle of incidence of the light. However, this only affects light having small incidence angles. Therefore, the wide-angle light still cannot be efficiently emitted by the LED.

What is needed, therefore, is an LED, which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one".

References will be made to the drawings to describe, various embodiments of the present LED.

Figure 1:
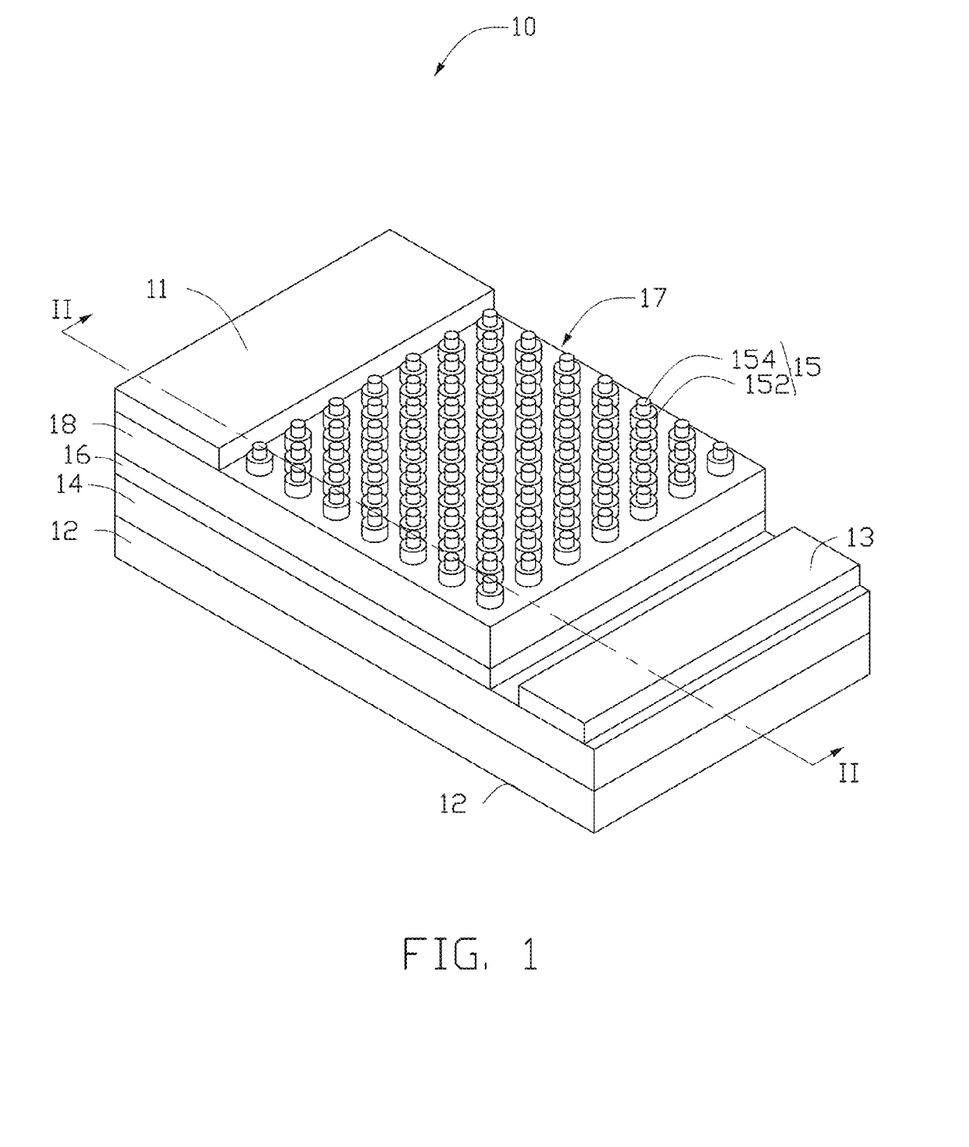
FIG. 1 is a schematic view of one embodiment of an LED.
Figure 2:
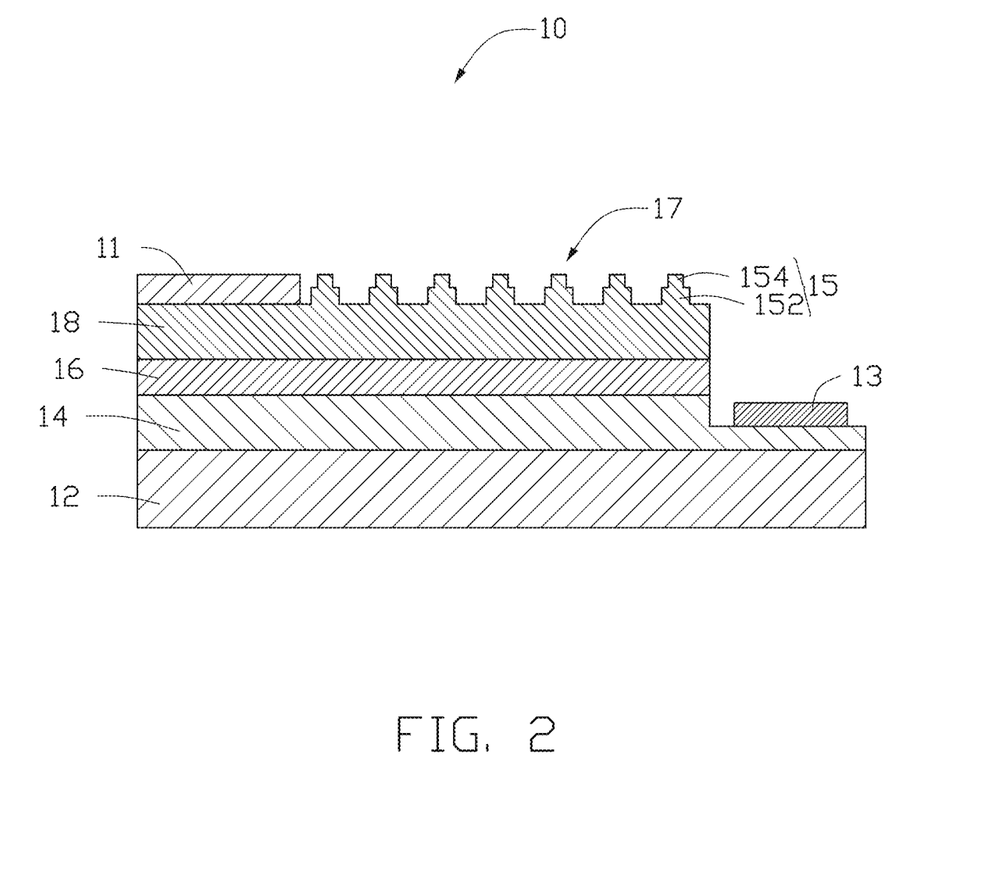
FIG. 2 is a schematic, cross-sectional view, taken along a line II-II of FIG. 1.

Referring to FIGS. 1 to 2, an embodiment of an LED 10 includes a substrate 12, a first semiconductor layer 14, an active layer 16, a second semiconductor layer 18, a first electrode 13, a second electrode 11, and a three-dimensional nano-structure array 17.

The first semiconductor layer 14, the active layer 16, and the second semiconductor layer 18 are orderly stacked on a top surface of the substrate 12. The first electrode 13 is electrically connected to the first semiconductor layer 14. The second electrode 11 is electrically connected to the second semiconductor layer 18. The three-dimensional nano-structure array 17 can be located on a top surface of the second semiconductor layer 18 away from the substrate 12.

The substrate 12 supports other elements, such as the first semiconductor layer 14 and the second semiconductor layer 18. The substrate 12 can have a thickness of about 300 micrometers (μm) to about 500 μm. The substrate 12 can be made of sapphire, gallium arsenide, indium phosphate, silicon nitride, gallium nitride, zinc oxide, aluminum silicon nitride, silicon carbon, or their combinations. In one embodiment, the substrate 12 is made of sapphire and has a thickness of about 400 μm.

Further, a buffer layer (not shown) may be interposed between the substrate 12 and the first semiconductor layer 14. The buffer layer contacts both the top surface of the substrate 12 and a bottom surface of the first semiconductor layer 14. If the buffer layer is not used, the bottom surface of the first semiconductor layer 14 is located directly on a surface of the substrate 12. The buffer layer improves epitaxial growth of the first semiconductor layer 14 and decreases any lattice mismatch between the first semiconductor layer 14 and the substrate 12. The buffer layer can be made of gallium nitride (GaN), aluminum nitride (AlN), or the like. The thickness of the buffer layer can be in a range from about 10 nanometers (nm) to about 300 nm. In one embodiment, the buffer layer is formed on the substrate 12 and made of GaN. The buffer layer can have a thickness of about 20 nm to about 50 nm.

The first semiconductor layer 14 can have a stepped structure and includes the bottom surface, a lower top surface, and an upper surface, all substantially parallel to each other. The bottom surface, the lower top surface, and the upper top surface of the first semiconductor layer 14 have different heights, creating the steps. The lower and upper top surfaces of the first semiconductor layer 14 are opposite to the bottom surface. With respect to the bottom surface of the first semiconductor layer 14, a height of the lower top surface of the first semiconductor layer 14 is lower than a height of the upper top surface of the first semiconductor layer 14. The distance between the lower top surface and the bottom surface of the first semiconductor layer 14 is shorter than a distance between the upper top surface and the bottom surface of the first semiconductor layer 14. The active layer 16 and the second semiconductor layer 18 are arranged on the upper top surface of the first semiconductor layer 14. In one embodiment, an area of contact between the upper top surface of the first semiconductor layer 14 and the active layer 16 is approximately equal to a total area of the upper top surface. The second semiconductor layer 18 fully covers a top surface of the active layer 16 away from the substrate 12. In one embodiment, the upper top surface and the lower top surface of the first semiconductor layer 14 are in a same plane, which means that the height of the upper top surface and the lower top surface with respect to the bottom surface is approximately equal. The active layer 16 and the second semiconductor layer 18 are orderly stacked on the upper top surface of the first semiconductor layer 14 to form the stepped structure. The first electrode 13 is located on the lower top surface of the first semiconductor layer 14.

If the first semiconductor layer 14 is an N-type semiconductor, the second semiconductor layer 18 is a P-type semiconductor, and vice versa. The N-type semiconductor layer provides negative electrons, and the P-type semiconductor layer provides positive holes. The N-type semiconductor layer can be made of N-type gallium nitride, N-type gallium arsenide, or N-type copper phosphate. The P-type semiconductor layer can be made of P-type gallium nitride, P-type gallium arsenide, or P-type copper phosphate. The first semiconductor layer 14 can have a thickness of about 1 μm to about 5 μm. The second semiconductor layer 18 can have a thickness of about 0.1 μm to about 3 μm. In one embodiment, the first semiconductor layer 14 is an N-type semiconductor. The distance between the bottom surface and the upper top surface of the first semiconductor layer 14 is about 0.3 μm. The distance between the bottom surface and the lower top surface of the first semiconductor layer 14 is about 0.1 μm. The second semiconductor layer 18 is a P-type semiconductor. The second semiconductor layer 18 has a thickness of about 0.3 μm and is made of P-type gallium nitride.

The active layer 16 can be located on the upper top surface of the first semiconductor layer 14. The active layer 16 is a photon exciting layer and can be one of a single quantum well layer or multilayer quantum well films. The active layer 16 can be made of gallium indium nitride (GaInN), aluminum indium gallium nitride (AlGaInN), gallium arsenide (GaSn), aluminum gallium arsenide (AlGaSn), gallium indium phosphide (GaInP), or aluminum gallium arsenide (GaInSn). The active layer 16, in which the electrons fill the holes, can have a thickness of about 0.01 μm to about 0.6 μm. In one embodiment, the active layer 16 has a thickness of about 0.3 μm and includes one layer of GaInN stacked with a layer of GaN. The distance between the lower top surface of the first semiconductor layer 14 and the top surface of the second semiconductor layer 18, which is away from the substrate 12, is about 0.8 μm.

The first electrode 13 may be a P-type or an N-type electrode and is the same type as the first semiconductor layer 14. The second electrode 11 may be a P-type or an N-type electrode and is the same type as the second semiconductor layer 18. The thickness of the first electrode 13 can range from about 0.01 μm to about 2 μm. The thickness of the second electrode 11 can range from about 0.01 μm to about 2 μm. The first electrode 13 can be made of titanium, aluminum, nickel, gold, or a combination thereof. In one embodiment, the first electrode 13 is a P-type electrode and includes a nickel layer and a gold layer. The thickness of the nickel layer is about 150 angstroms. The thickness of the gold layer is about 1000 angstroms. In one embodiment, the second electrode 11 is an N-type electrode and includes a titanium layer and a gold layer. The thickness of the titanium layer is about 150 angstroms. The thickness of the gold layer is about 2000 angstroms. In one embodiment, the first electrode 13 is located on the lower surface of the first semiconductor layer 14, and the second electrode 11 is located on the top surface of the second semiconductor layer 18 and covers part of the top surface of the second semiconductor layer 18.

The three-dimensional nano-structure array 17 includes a number of three-dimensional nano-structures 15. Each of the three-dimensional nano-structures 15 has a stepped structure. The material of the three-dimensional nano-structure 15 can be the same as the material of the second semiconductor layer 18 so that the three-dimensional nano-structure 15 and the second semiconductor layer 18 are integral. The three-dimensional nano-structures 15 can be arranged in the form of an array. The three-dimensional nano-structures 15 in the array can be hexagonally arranged, in the form of squares, or concentrically arranged. The three-dimensional nano-structures 15 can be arranged to form a single pattern or a pattern group. The single pattern can be a triangle, parallelogram, diamond, square, trapezoid, rectangle, or circle. The pattern group can include a number of the same or different single patterns. In one embodiment, the three-dimensional nano-structures 15 are hexagonally arranged.

The three-dimensional nano-structures 15 can be a stepped bulge. The stepped bulge is a stepped body protruding out from the surface of the second semiconductor layer 18. The stepped bulge can be a multi-layer structure such as a multi-layer frustum of a prism, a multi-layer frustum of a cone, or a multi-layer cylinder. In one embodiment, the three-dimensional nano-structure 15 is a stepped cylindrical structure. The size of the three-dimensional nano-structure 15 is less than or equal to 1000 nanometers, namely, the length, the width, and the height are less than or equal to 1000 nanometers. In one embodiment, the length, the width, and the height of the three-dimensional nano-structure 15 are in a range from about 10 nanometers to about 500 nanometers.

Figure 3:
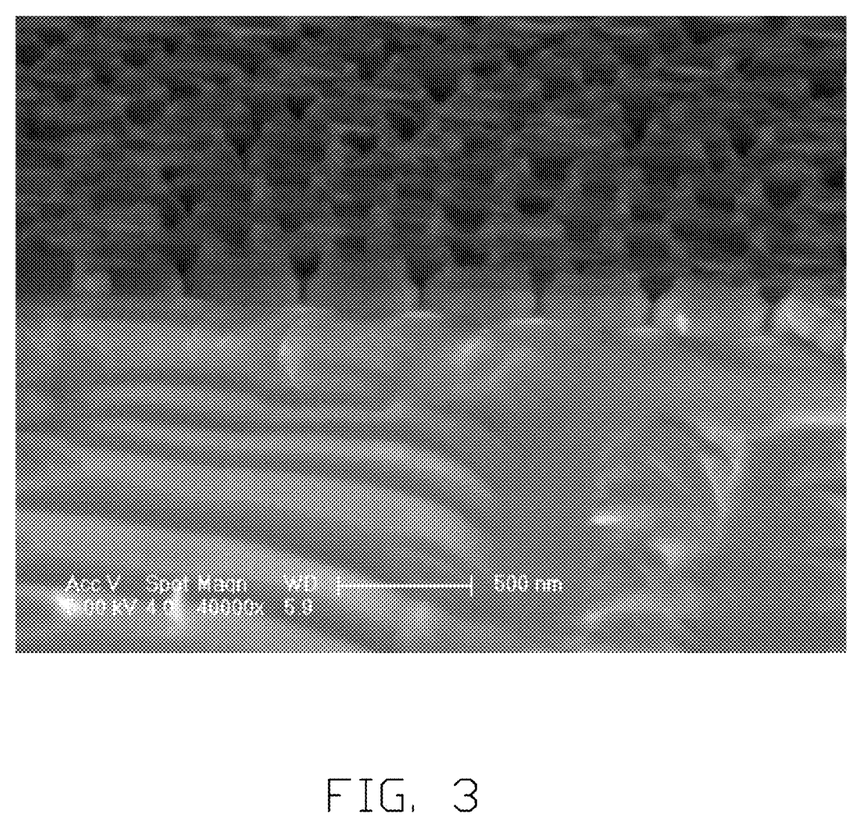
FIG. 3 is a Scanning Electron Microscope (SEM) image of one embodiment of a three-dimensional nano-structure array of an LED.

Referring to FIGS. 2 and 3, in one embodiment, the three-dimensional nano-structure 15 is a two-layer cylindrical structure including a first cylinder 152 and a second cylinder 154 extending from a top of the first cylinder 152. The diameter of the second cylinder 154 is less than the diameter of first cylinder 152 to form the stepped structure. The first cylinder 152 extends substantially perpendicularly upwards from the surface of the second semiconductor layer 18. The second cylinder 154 extends substantially perpendicularly upwards from a top surface of the first cylinder 152. The second cylinder 154 and the first cylinder 152 can be coaxial. The second cylinder 154 and the first cylinder 152 can be an integral structure, namely the second cylinder 154 is a body protruding from the first cylinder 152. The two adjacent three-dimensional nano-structures 15 are substantially equidistantly arranged.

In one embodiment, the diameter of the first cylinder 152 can be in a range from about 30 nanometers to about 1000 nanometers. The height of the first cylinder 152 can be in a range from about 50 nanometers to about 1000 nanometers. The diameter of the second cylinder 154 can be in a range from about 10 nanometers to about 500 nanometers. The height of the second cylinder 154 can be in a range from about 20 nanometers to about 500 nanometers. The distance between two adjacent first cylinders 104 can be in a range from about 10 nanometers to about 1000 nanometers.

In one embodiment, the diameter of the first cylinder 152 can be in a range from about 50 nanometers to about 200 nanometers. The height of the first cylinder 152 can be in a range from about 100 nanometers to about 500 nanometers. The diameter of the second cylinder 154 can be in a range from about 20 nanometers to about 200 nanometers. The height of the second cylinder 154 can be in a range from about 100 nanometers to about 300 nanometers. The distance between two adjacent first cylinders 104 can be in a range from about 10 nanometers to about 30 nanometers. Thus, both the first cylinders 104 and the second cylinders 154 can be considered as photonic crystal structures.

In one embodiment, the diameter of the first cylinder 152 is about 380 nanometers, the height of the first cylinder 152 is about 105 nanometers, the diameter of the second cylinder 154 is about 280 nanometers, the height of the second cylinder 154 is about 55 nanometers, and the distance between two adjacent first cylinders 104 is about 30 nanometers.

The three-dimensional nano-structure array 10 includes at least two layers of three-dimensional nano-structures arranged in the form of an array.

The three-dimensional nano-structure 15 can further include a third cylinder located on a top surface of the second cylinder 154. The third cylinder, the second cylinder 154, and the first cylinder 152 can be coaxial.

Figure 4:
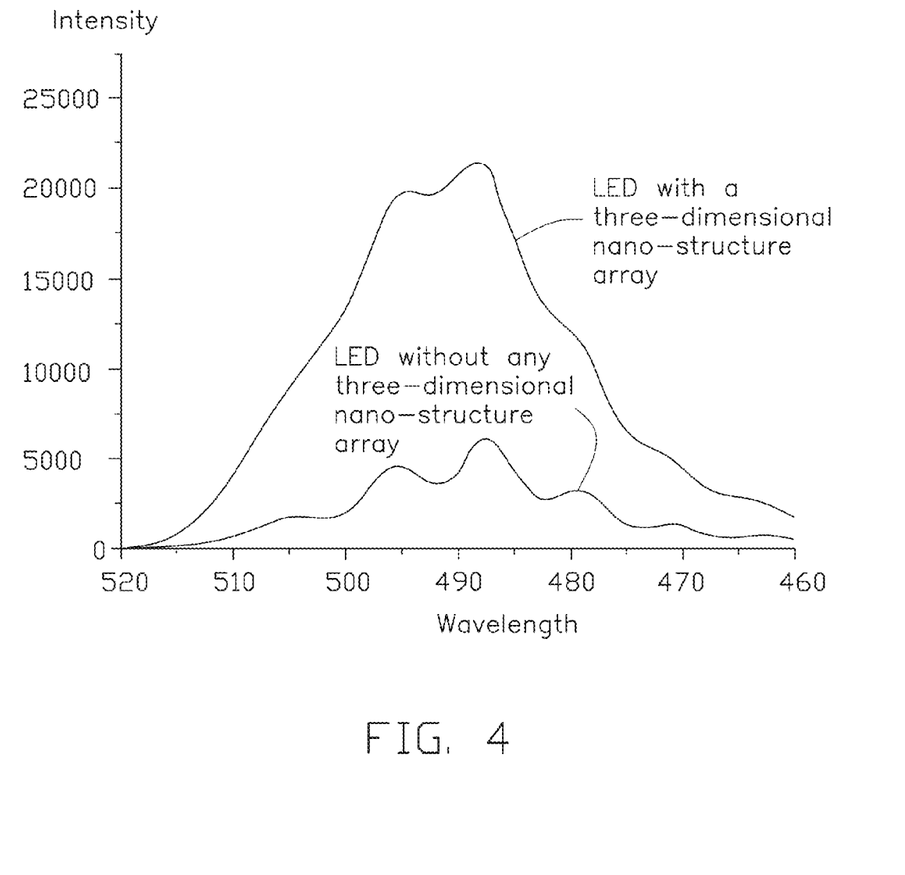
FIG. 4 shows a light extraction efficiency of an LED with a three-dimensional nano-structure array and a light extraction efficiency of an LED without any three-dimensional nano-structure array.

In use, the light emitted from the active layer 16 reaches the three-dimensional nano-structure array 17 at different angles of incidence. The light at relatively small incidence angles can exit easily. The light at relatively large incidence angles is diffracted by the three-dimensional nano-structure array 17 so that the incidence angles of the light are reduced. Thus, the light at relatively large incidence angles can exit to the outside after being diffracted to small angles. Both the first cylinder 152 and the second cylinder 154 can be linked to photonic crystal structures to contribute to the light extraction efficiency of the LED 10, thus, the light extraction of the LED 10 is improved. FIG. 4 shows a light extraction efficiency of an LED 10 with a three-dimensional nano-structure array 17 and a light extraction efficiency of an LED without any three-dimensional nano-structure array. The light extraction efficiency of an LED 10 with a three-dimensional nano-structure array 17 is about 4 times that of the LED without any three-dimensional nano-structure array.

Figure 5:
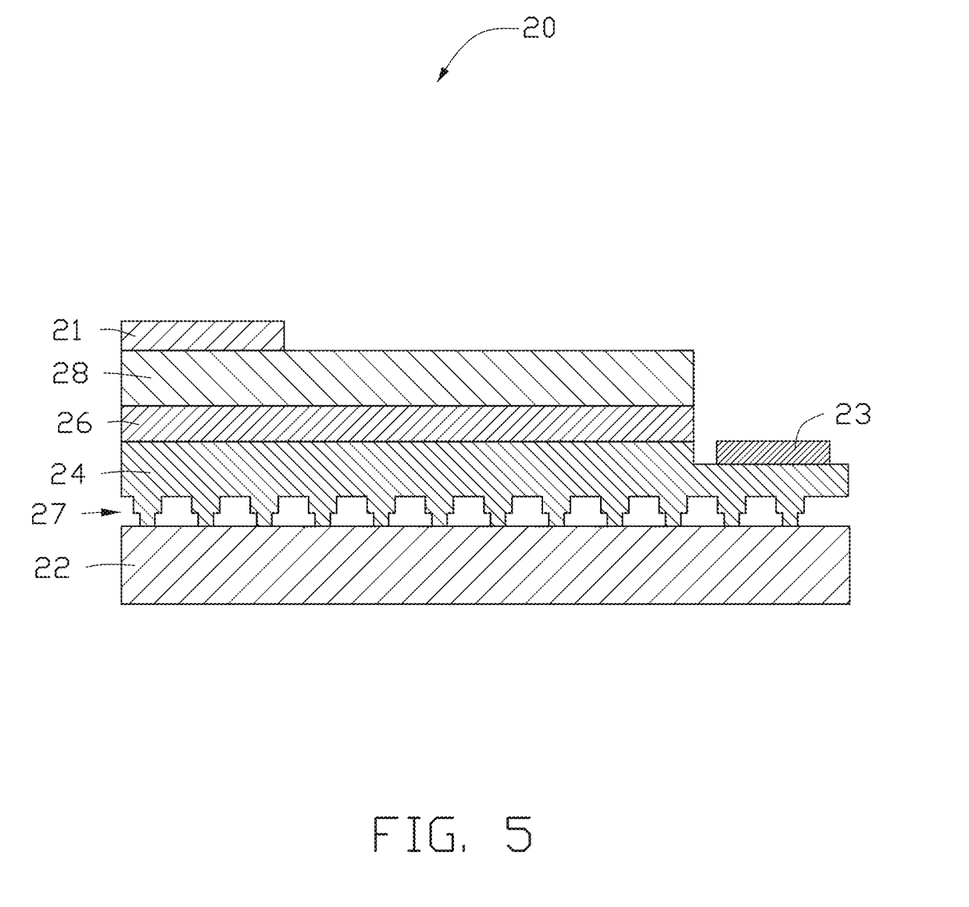
FIG. 5 is a schematic view of one embodiment of an LED.

Referring to FIG. 5, an embodiment of an LED 20 includes a substrate 22, a first semiconductor layer 24, an active layer 26, a second semiconductor layer 28, a first electrode 23, a second electrode 21, and a three-dimensional nano-structure array 27. The LED 20 is similar to the LED 10 described above except that the three-dimensional nano-structure array 27 is formed on a surface of the first semiconductor layer 24 and between the first semiconductor layer 24 and the substrate 22.

Figure 6:
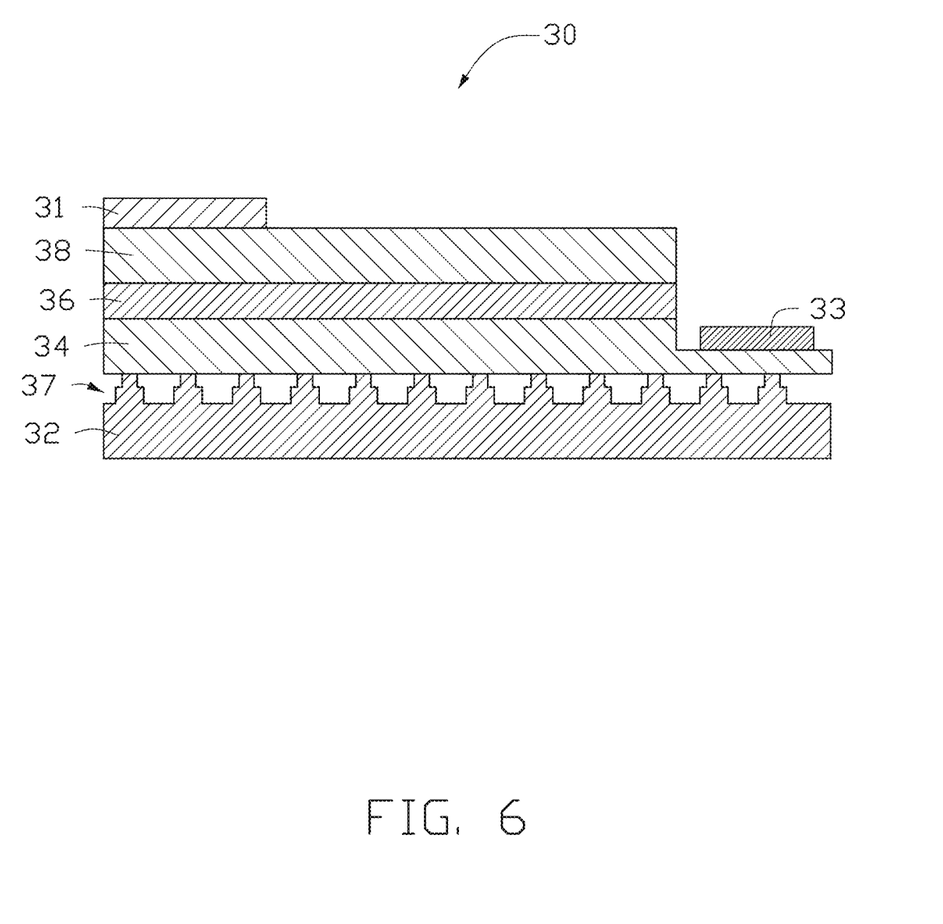
FIG. 6 is a schematic view of one embodiment of an LED.

Referring to FIG. 6, an embodiment of an LED 30 includes a substrate 32, a first semiconductor layer 34, an active layer 36, a second semiconductor layer 38, a first electrode 33, a second electrode 31, and a three-dimensional nano-structure array 37. The LED 30 is similar to the LED 10 described above except that the three-dimensional nano-structure array 37 is formed on a surface of the substrate 32 and between the first semiconductor layer 34 and the substrate 32.

In use, the light emitted from the active layer 26, 36 reaches the second semiconductor layer 28, 38 at different angles of incidence. The light at relatively small incidence angles can easily exit. The light at relatively large incidence angles are reflected back into the LEDs 20, 30 and diffracted by the three-dimensional nano-structure array 27, 37 to become light at relatively small incidence angles. Through diffraction, the change of the light at relatively large incidence angles into light at relatively small incidence angles, improves the light extracting performance of the LEDs 20, 30. Because the light path in the LEDs 20, 30 is reduced, the loss of light will be reduced.

Figure 7:
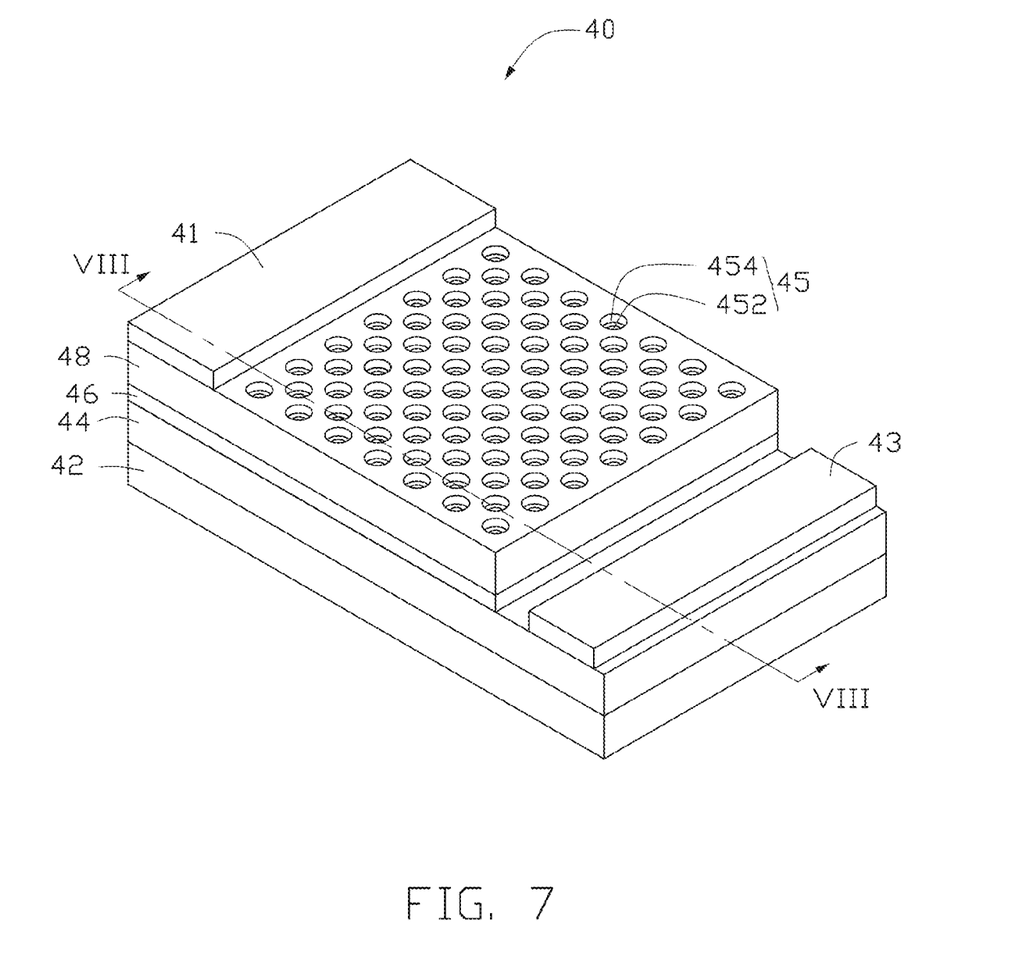
FIG. 7 is a schematic view of one embodiment of an LED.
Figure 8:
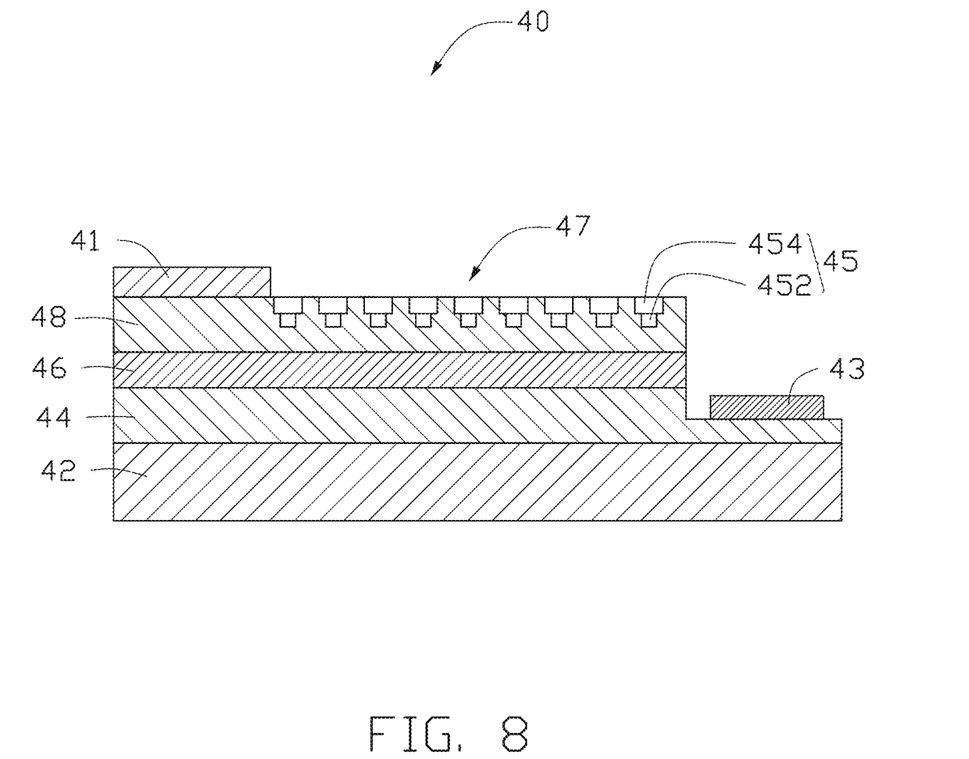
FIG. 8 is a schematic, cross-sectional view, taken along a line II-II of FIG. 7.

Referring to FIGS. 7 and 8, an embodiment of an LED 40 includes a substrate 42, a first semiconductor layer 44, an active layer 46, a second semiconductor layer 48, a first electrode 43, a second electrode 41, and a three-dimensional nano-structure array 47. The LED 40 is similar to the LED 10 described above except that the three-dimensional nano-structure array 47 includes a number of three-dimensional nano-structures 45, and each of the three-dimensional nano-structures 45 is inverted. Each three-dimensional nano-structure 45 is a blind hole in the surface of the second semiconductor layer 48 and includes two interlinked passages. A stepped configuration is formed where the two interlinked passages join. The shape of the three-dimensional nano-structure 45 can be a multi-layer structure such as a multi-layer frustum of a prism, a multi-layer frustum of a cone, or a multi-layer cylinder. In one embodiment, the shape of the three-dimensional nano-structure 45 is a two-layer cylindrical structure including a first cylindrical space 452 and a second cylindrical space 454 substantially coaxially aligned with the first cylindrical space 452. The second cylindrical space 454 is adjacent to the surface of the second semiconductor layer 48. The diameter of the second cylindrical space 454 is greater than the diameter of first cylindrical space 452. The first cylindrical space 452 can be considered a first photonic crystal structure and the second cylindrical space 454 can be considered another photonic crystal structure formed on top of the first photonic crystal structure to contribute to greater light extraction of the LED 40.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A light emitting diode, comprising:
a substrate;
a first semiconductor layer;
an active layer;
a second semiconductor layer;
a first electrode electrically connected to the first semiconductor layer; and
a second electrode electrically connected to the second semiconductor layer, wherein the first semiconductor layer, the active layer, and the second semiconductor layer are stacked in that order on the substrate; and wherein the first semiconductor layer comprises a first surface and a second surface opposite to the first surface, the active layer is attached on the second surface, the substrate has a plurality of three-dimensional nano-structures, the plurality of three-dimensional nano-structures are adjoined to the first surface, and each of the plurality of three-dimensional nano-structures has a stepped structure; the plurality of three-dimensional nano-structures are defined in the substrate, and each of the plurality of three-dimensional nano-structures is hollow and comprises two interlinked spaces, and a stepped configuration is formed where the two interlinked spaces are joined with each other; and each of the plurality of three-dimensional nano-structures comprises a first cylindrical space and a second cylindrical space aligned with the first cylindrical space and adjacent to the first semiconductor layer.

2. The light emitting diode of claim 1, wherein the first cylindrical space and the second cylindrical space are substantially coaxial.

3. The light emitting diode of claim 2, wherein the first cylindrical space and the second cylindrical space are coaxial, and a diameter of the first cylindrical space is greater than a diameter of the second cylindrical space.

4. The light emitting diode of claim 1, wherein the first cylindrical space extends substantially perpendicularly and downwardly from the surface of the substrate, and the second cylindrical space extends substantially perpendicularly and downwardly from a top surface of the first cylindrical space.

5. The light emitting diode of claim 1, wherein a diameter of the first cylindrical space is in a range from about 30 nanometers to about 1000 nanometers, a height of the first cylindrical space is in a range from about 50 nanometers to about 1000 nanometers, a diameter of the second cylindrical space is in a range from about 10 nanometers to about 500 nanometers, a height of the second cylindrical space is in a range from about 20 nanometers to about 500 nanometers, and a distance between two adjacent first cylindrical spaces is in a range from about 10 nanometers to about 1000 nanometers.

6. The light emitting diode of claim 1, wherein each of the plurality of three-dimensional nano-structures comprises a third cylindrical space located on the second cylindrical space.

7. The light emitting diode of claim 1, wherein the plurality of three-dimensional nano-structures is defined in the substrate adjacent to the first semiconductor layer, each of the plurality of three-dimensional nano-structures is hollow and comprises two interlinked spaces, and a stepped configuration is formed where the two interlinked spaces are joined with each other.

8. A light emitting diode, comprising:
a substrate;
a first semiconductor layer;
an active layer;
a second semiconductor layer;
a first electrode electrically connected to the first semiconductor layer; and
a second electrode electrically connected to the second semiconductor layer, wherein the first semiconductor layer, the active layer, and the second semiconductor layer are stacked in that order on the substrate; and wherein the first semiconductor layer comprises a first surface and a second surface opposite to the first surface, the active layer is attached on the second surface, the substrate has a plurality of three-dimensional nano-structures, the plurality of three-dimensional nano-structures are adjoined to the first surface, and each of the plurality of three-dimensional nano-structures has a stepped structure and comprises a first cylinder located on the substrate and a second cylinder located on the first cylinder; a diameter of the first cylindrical is in a range from about 30 nanometers to about 1000 nanometers, a height of the first cylindrical is in a range from about 50 nanometers to about 1000 nanometers, a diameter of the second cylindrical is in a range from about 10 nanometers to about 500 nanometers, a height of the second cylindrical is in a range from about 20 nanometers to about 500 nanometers, and a distance between two adjacent first cylindrical is in a range from about 10 nanometers to about 1000 nanometers.

9. The light emitting diode of claim 8, wherein the second cylinder and the first cylinder are substantially coaxial.

10. The light emitting diode of claim 8, wherein the first cylinder extends substantially perpendicularly and upwardly from the surface of the substrate, and the second cylinder extends substantially perpendicularly and upwardly from a top surface of the first cylinder.

11. The light emitting diode of claim 8, wherein each of the plurality of three-dimensional nano-structures comprises a third cylinder located on the second cylinder.

* * * * *